United States Patent [19]
Ackerman et al.

[11] Patent Number: 5,506,859
[45] Date of Patent: Apr. 9, 1996

[54] ARTICLE COMPRISING A DFB LASER WITH LOSS COUPLING

[75] Inventors: David A. Ackerman, Hopewell; Leonard J. Ketelsen, Clinton, both of N.J.

[73] Assignee: AT&T Corp., Murray Hill, N.J.

[21] Appl. No.: 389,665

[22] Filed: Feb. 16, 1995

[51] Int. Cl.⁶ .................................................. H01S 3/08
[52] U.S. Cl. ........................................... 372/96; 372/45
[58] Field of Search ............................... 372/96, 45, 20

[56]  References Cited

U.S. PATENT DOCUMENTS

| | | | |
|---|---|---|---|
| 5,319,666 | 6/1994 | Ackerman | 372/96 |
| 5,452,318 | 9/1995 | Makino et al. | 372/96 |

OTHER PUBLICATIONS

"Yield Analysis of Non–AR–Coated DFB Lasers With Combined Index and Gain Coupling", by David, Morthier, Vankwikelberge and Baets, *Electronics Letters*, vol. 26, No. 4, 15 Feb. 1990, pp. 238–239.

"1.55μm Gain–Coupled Quantum–Well Distributed Feedback Lasers with High Single–Mode Yield and Narrow Linewidth", by B. Borchert et al., *IEEE Transactions Photonics Technology Letters*, vol. 3, No. 11, Nov., 1991, pp. 955–957.

"Linewidth Reduction of DSM Lasers Due to Effects of Composite Cavity and Distributed Reflectors", by K. Kudo et al., *IEEE Journal of Quantum Electronics*, vol. 29, No. 6, Jun. 1993, pp. 1769–1781.

"The Optical Gain Coupling Saturation Effect on the Linewidth Property of Complex Coupled DFB Lasers", by K. Kudo et al., *IEEE Photonics Technology Letters*, vol. 6, No. 4, Apr. 1994, pp. 482–485.

"The Weighted Index Method: A New Technique For Analyzing Planar Optical Waveguides", by M. J. Robertson et al., *Journal of Lightwave Technology*, vol. 7, No. 12, Dec. 1989, pp. 2105–2111.

*Primary Examiner*—James W. Davie
*Attorney, Agent, or Firm*—Eugen E. Pacher

[57]  ABSTRACT

A DFB laser with improved loss grating is disclosed. The grating contains periodically patterned first and second semiconductor layers that are embedded in semiconductor material of composition selected to provide relatively low loss for the laser radiation. The composition of the first layer is selected to provide a relatively high refractive index and loss for the laser radiation, and the composition of the second layer is selected to provide relatively low refractive index and loss for the laser radiation. The thicknesses of the first and second layers are selected such that the real part of the coupling constant $|\kappa'|$ is less than the imaginary part of the coupling constant $|\kappa''|$. In preferred embodiments $|\kappa'| \leq 0.5|\kappa''|$, even $\leq 0.2|\kappa''|$.

5 Claims, 2 Drawing Sheets

ARTICLE COMPRISING A DFB LASER WITH LOSS COUPLING

FIELD OF THE INVENTION

This invention pertains to distributed feedback (DFB) lasers, and to articles (e.g., transmitters for optical fiber communication systems) that comprise DFB lasers.

BACKGROUND OF THE INVENTION

DFB lasers are known and are increasingly finding use in applications that require a stable source of electromagnetic radiation of narrow line width, e.g., as source of the signal radiation in optical fiber communication systems.

Prior art DFB lasers generally involve refractive index-coupling, i.e., they comprise a periodic variation in the longitudinal direction of the refractive index of the laser, substantially without periodic variation of the gain or loss of the structure. Such lasers are subject to, inter alia, spatial hole burning, which detracts from their usefulness. The periodically varying region of the laser structure is generally referred to as the "grating".

Loss (or gain; henceforth collectively "loss") coupled DFB lasers are also known. See, for instance, K. David et al., *Electronics Letters*, Vol. 26, p. 238 (1990). Such lasers comprise a periodic variation in loss in the longitudinal direction of the laser. This is typically expressed in terms of a complex coupling constant $\kappa=(\kappa'+i\kappa'')$.

It is generally believed that loss-coupled lasers will exhibit advantageous properties, e.g., reduced spatial hole burning, reduced sensitivity to external reflections, lower frequency chirp, and increased spectral stability. However, in reported loss-coupled lasers the real part $\kappa'$ of $\kappa$ typically has substantial magnitude, typically resulting in compromised performance, as compared to the performance expected from lasers that have $\kappa'=0$. See, for instance, B. Borchert et al., *IEEE Transactions Photonic Technology Letters*, Vol. 3(11), p. 955 (1991), which discloses a loss-coupled DFB laser with substantially equal index and gain (loss) coupling strength, namely, about 30/cm; in other words, with $|\kappa'|\sim|\kappa''|$. Among other publications of interest is K. Kudo et al., *IEEE Journal of Quantum Electronics*, Vol. 29(6), p. 1769 (1993), which discloses "complex-coupled" (i.e., gain+index-coupled) lasers with "corrugated" active region. See also J. Kudo et al., *IEEE Photonics Technology Letters*, Vol. 6(4), p. 482 (1994), which discloses a complex-coupled (including gain-coupled) laser with periodically partitioned active layer, with an identically partitioned "depression layer" on the active layer.

In view of the advantageous characteristics associated with a loss-coupled laser it would be highly desirable to have available a readily manufacturable laser structure that can provide substantially pure loss-coupling. This application discloses such a laser structure.

GLOSSARY AND DEFINITIONS

A semiconductor material is "substantially lossless" for radiation of wavelength $\lambda$ if the radiation cannot create electron/hole pairs in the material by excitation of electrons across the bandgap of the material. On the other hand, if the radiation is able to create electron/hole pairs in a semiconductor material by excitation of electrons across the bandgap then the material is "lossy" for the radiation. Terms substantially equivalent to "substantially lossless" or "lossy" are intended to have the above specified meaning.

SUMMARY OF THE INVENTION

In a broad aspect the invention is embodied in an article that comprises a DFB laser that is substantially loss coupled, i.e., that has a structure that provides for $|\kappa'|<|\kappa''|$, typically $|\kappa'|\leq 0.5|\kappa''|$, preferably $|\kappa'|\leq 0.2\ |\kappa''|$, where the bars indicate the absolute value.

More specifically, the laser comprises a semiconductor layer structure, (typically comprising III-V semiconductor material), and contacts for flowing an electric current through the layer structure such that the laser emits radiation of wavelength $\lambda$. The wavelength will typically be in a range that includes the communication wavelengths 0.8 μm, 1.3 μm and 1.55 μm. The layer structure comprises an active layer of substantially uniform thickness that extends the length of the laser, and further comprises a grating region that is spaced from the active layer. Significantly, the grating region comprises a first and a second periodically patterned semiconductor layer, said first and second patterned layers being embedded in semiconductor material of composition $Q_1$ selected to provide relatively low loss for the radiation of wavelength $\lambda$. The first and second periodically patterned semiconductor layers have compositions selected to have, respectively, a relatively high real refractive index and loss for the radiation of wavelength $\lambda$, and a relatively low real refractive index and loss for the radiation of wavelength $\lambda$. Furthermore, the respective thicknesses of said first and second periodically patterned semiconductor layers are selected such that $|\kappa''|<|\kappa''|$, preferably $|\kappa'|\leq 0.5|\kappa''|$ or even less than $0.2|\kappa''|$. Typically the first and second patterned layers are in contact with each other and have the same periodicity, including zero phase shift between the periodically patterned layers.

Although it is expected that in most cases there will be a single first periodically patterned semiconductor layer and a single second such layer, this is not necessarily so. At least in principle the first layer can consist of two or more sub-layers, and/or the second layer can consist of two or more sublayers, provided that the thicknesses are selected such that the coupling constant requirements are met.

In the above-described structure it is possible, through appropriate selection of layer compositions and layer thicknesses, to arrange their relations so that the relevant mode of the radiation experiences substantially no variation in real refractive index along the longitudinal direction of the laser. Consequently, the absolute value of the real part ($|\kappa'|$) of the coupling constant can be small or even zero, whereas the absolute value of the imaginary part ($|\kappa''|$) can be of substantial magnitude.

The invention can be embodied in substantially any type of DFB laser, including EMBH, CMBH and ridge lasers, designed for emission at, for instance, 1.3 μm or 1.55 μm, or more complicated structures which comprise a DFB laser such as an EML (electroabsorption modulated laser). The lasers can use any coating scheme, e.g., AR/AR or HR/AR, and can be based on any appropriate material system, e.g., GaAs, InP or InGaAsP. The grating can be a bulk grating or a multiquantum well grating, either lattice matched or strained, either above or below the active region. Lasers according to the invention can be used, for instance, in digital or analog optical fiber communication systems, and can be of the cooled or uncooled type. The above recited acronyms are generally familiar to those skilled in the art.

DETAILED DESCRIPTION OF EXEMPLARY EMBODIMENTS

An exemplary embodiment of the invention, designed for emission of radiation of wavelength $\lambda=1.3$ μm, is made as follows.

Figure 1:
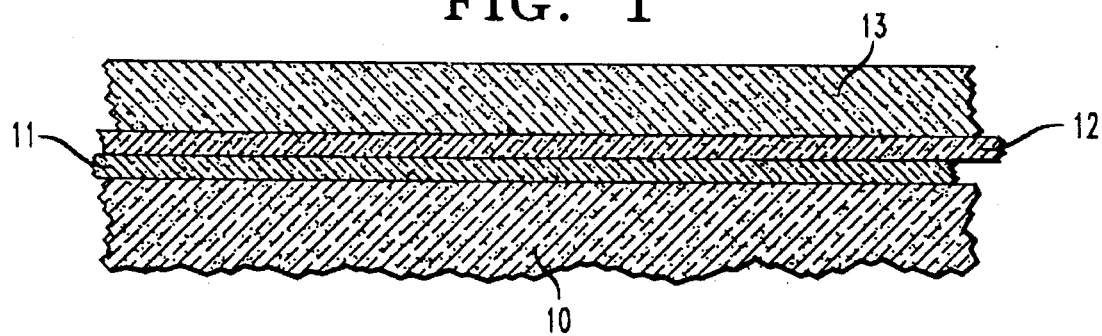
FIGS. 1–3 schematically depict an exemplary grating structure according to the invention at various stages of manufacture.
Figure 2:
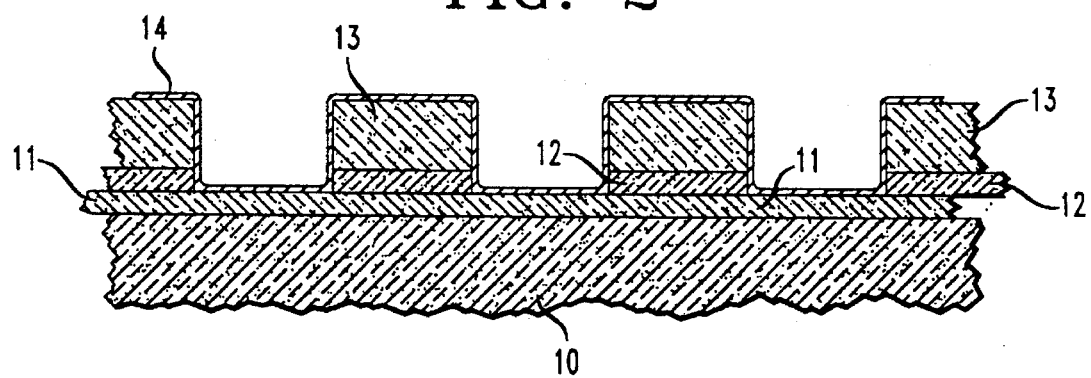

After formation of the layer structure of FIG. 1 on conventional InP substrate 10, a grating of approximate periodicity 0.203 μm and 50% duty factor is formed in the layer structure by conventional photolithography and etching (exemplarily by reactive ion etching), as is schematically shown in FIG. 2. In the former figure, reference numerals 11–13 refer to, respectively, 20 nm $Q_1$ material, 35 nm $Q_2$ material, and 64.5 nm InP. $Q_1$ and $Q_2$ refer to quaternary III/V material of composition specified by wavelengths 1.21 μm and 1.45 μm, respectively. Those skilled in the art will appreciate that the material of composition $Q_1$ and InP are substantially lossless at 1.31 μm, whereas material of composition $Q_2$ is lossy at 1.31 μm. Furthermore, the material of composition $Q_2$ has a relatively large real refractive index at 1.3 μm, as compared to InP.

After etching of the grating it is typically desirable to stabilize the grating. This can, for instance, be accomplished by deposition of a thin layer 14 of Ga onto the etched wafer surface. Subsequently, material of composition $Q_1$ is deposited and the surface is planarized to yield a substantially planar surface 110, as is shown schematically in FIG. 3.

Figure 4:
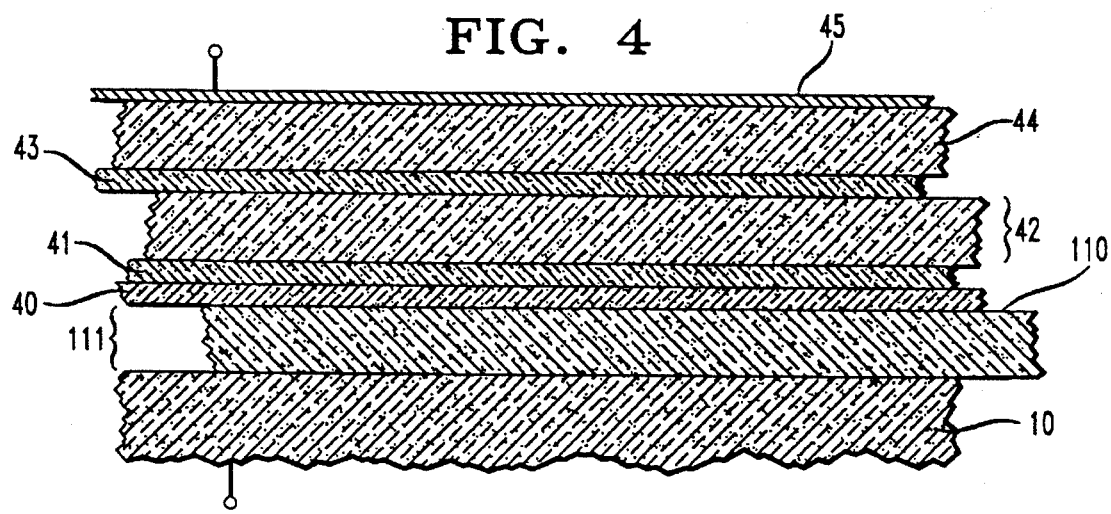
FIG. 4 shows schematically the layer structure of an exemplary laser according to the invention.

On surface 110 can be grown a conventional layer structure, as is shown schematically in FIG. 4, wherein numeral 111 refers to the above-described grating structure, and numerals 40–44 refer to a 300 nm InP spacer layer, 50 nm lower confinement layer of composition $Q_3$, multiquantum well active region, 50 nm upper confinement layer of composition $Q_3$, and 700 nm InP cladding layer. Exemplarily the active region contains 7 wells of composition Q4 and thickness 7 nm, and 6 barriers of composition $Q_3$ and thickness 10 nm, where $Q_3$ corresponds to 1.12 μm, and $Q_4$ corresponds to 1.38 μm.

The thus produced layer structure is then processed in conventional fashion to yield lasers of appropriate length (e.g., 300 μm) and waveguide width (e.g., 1.0 μm). Mirrors and contacts (e.g., 45) are provided in conventional fashion.

Figure 5:
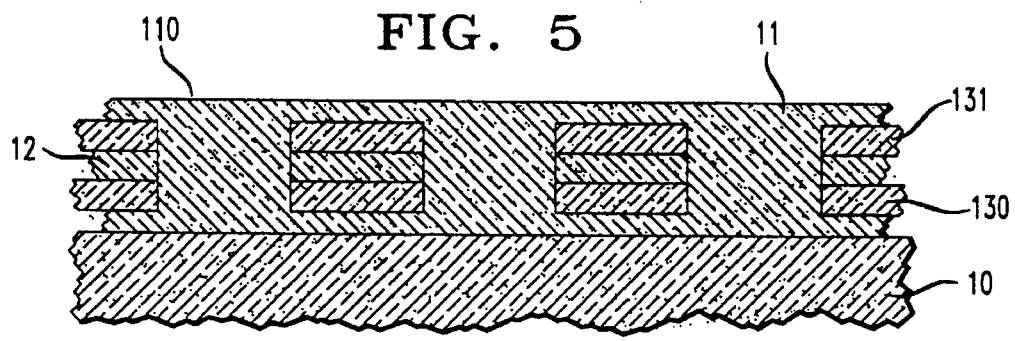
FIG. 5 shows another exemplary grating structure.

FIG. 5 schematically depicts the relevant aspects of a further embodiment of the laser according to the invention. The figure corresponds to FIG. 3 but shows the second periodically patterned semiconductor layer partitioned into sublayers 130 and 131.

Figure 3:
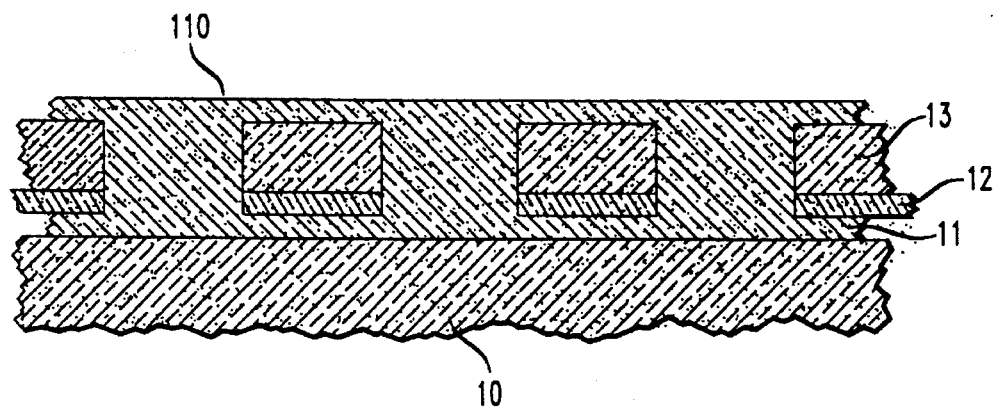

A significant aspect of the invention is the choice of thickness of the lossy grating layer (or layers) and the substantially lossless grating layer (or layers), e.g., layers 12 and 13 in FIGS. 2 and 3. These thicknesses are selected such that the mode-weighted real index of the 2-layer composite is substantially equal to that of the substantially lossless material in which the composite is embedded, e.g., the material of composition $Q_1$. The process of determining the appropriate layer thicknesses will now be illustrated.

The desired laser has a structure as shown schematically in FIG. 4, with InP substrate, and is designed to emit radiation of wavelength 1.3 μm. The grating is to be formed from a layer structure that is to consist, in sequence from the substrate up, of a 20 nm InGaAsP layer of composition $Q_1$ (bandgap 1.12 μm, real refractive index 3.349), followed by 20 nm InGaAsP of composition $Q_2$ (1.38 μm, real index 3.643), followed by InP of thickness to be determined, which in turn is followed by 20 nm InGaAsP of composition $Q_1$. The bandgap of InP is 0.92 μm, and the real index is 3.205.

The approximate thickness of the InP layer ($t_{InP}$) can be determined as follows:

$$t_{InP} = t_{Q2} \times (n_{Q2} - n_{Q1})/(n_{Q1} - n_{InP})$$

In this expression, $t_{Q2}$ is the thickness of the $Q_2$ layer, and $n_{Q2}$, $n_{Q1}$ and $n_{InP}$ are the real refractive indices of $Q_2$, $Q_1$ and InP, respectively. Inserting the numerical values yields $$t_{InP} = 20\ nm \times 0.294/0.144 = 40.8\ nm$$

The above-illustrated approximate treatment in many cases yields acceptable results, especially if the spacing between the active region and the grating is large enough such that the field of the guided mode can be assumed to be substantially constant over the grating region. If this is not the case, or if higher accuracy is desired, other known methods can be used to determine the layer thicknesses. Exemplary of these are two-dimensional effective index or finite-element-methods for calculating modal indices along the grating. See, for instance, M. J. Robertson et al., *J. Lightwave Technology*, Vol. 7(12), p. 2105 (1989).

Figure 6:
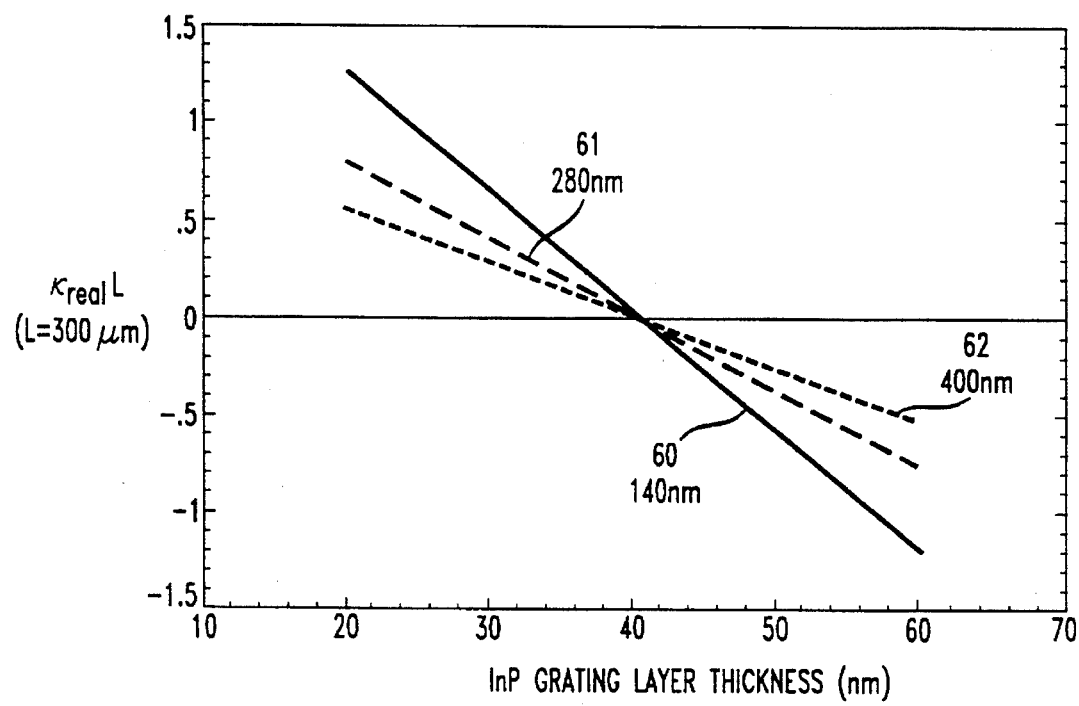
FIG. 6 shows exemplary data on the real coupling constant as a function of InP grating layer thickness, for an exemplary laser according to the invention.

It will be understood that typically the thickness of the lossy layer (e.g., 12) is pre-selected, based on considerations of the desired loss. It will also be understood that the spacing between the active region and the grating is a significant design parameter, as exemplified by FIG. 6, which shows the value of κ'L vs. the InP grating layer (e.g., 13) thickness, for three values of spacer layer thickness, for an exemplary laser of length L=300 μm. As can be seen from FIG. 6, in order, for instance, to achieve |κ'L|≦0.2, the actual thickness of the InP grating layer has to be within about ±3, ±5 and ±8 nm of the target value 40 nm, for spacing layer thickness of 140, 280 and 400 nm, respectively. Similar design criteria can be derived for other laser designs.

We claim:

1. An article comprising a semiconductor laser comprising a semiconductor layer structure and contacts for causing flow of an electric current through the layer structure such that the laser emits radiation of wavelength λ, the layer structure comprising an active layer of substantially uniform thickness and extending a length of the laser, and further comprising a grating region that is spaced from said active layer and comprises periodic variations, wherein associated with the laser is a complex coupling constant $\kappa=\kappa'+i\kappa''$;

CHARACTERIZED IN THAT said grating region comprises, in sequence,
  i) a first periodically patterned semiconductor layer of composition selected to have relatively high refractive index and loss for radiation of wavelength $\lambda$;
  ii) a second periodically patterned semiconductor layer of composition selected to have relatively low refractive index and loss for radiation of wavelength $\lambda$; wherein
  iii) said first and second periodically patterned layers are embedded in semiconductor material of composition $Q_1$ selected to provide relatively low loss for the radiation of wavelength $\lambda$; and
  iv) the thicknesses of said first and second layers are selected such that $|\kappa'|<|\kappa''|$.

2. Article according to claim 1, where $|\kappa'|\leq 0.5|\kappa''|$.

3. Article according to claim 2, where $|\kappa'|\leq 0.2|\kappa''|$.

4. Article according to claim 1, wherein said wavelength $\lambda$ is in a wavelength range that includes 0.8, 1.3 and 1.55 μm.

5. Article according to claim 4, wherein said layer structure comprises III–V semiconductor material.

* * * * *